US006735307B1

United States Patent
Völckers

(10) Patent No.: US 6,735,307 B1
(45) Date of Patent: May 11, 2004

(54) DEVICE AND METHOD FOR QUICKLY SELECTING TEXT FROM A LIST USING A NUMERIC TELEPHONE KEYPAD

(76) Inventor: Oliver Völckers, Schudomastrasse 5, D-12055 Berlin (DE)

( * ) Notice: Subject to any disclaimer, the term of this patent is extended or adjusted under 35 U.S.C. 154(b) by 0 days.

(21) Appl. No.: 09/582,493

(22) Filed: Aug. 25, 2000

(30) Foreign Application Priority Data

Oct. 28, 1998 (DE) ........................................ 198 49 460

(51) Int. Cl.⁷ ................................................ H04M 1/00
(52) U.S. Cl. ................................. 379/433.07; 379/368
(58) Field of Search ........................... 379/368, 433.06, 379/433.07; 341/22, 34; 200/5 R, 5 D; 455/90, 575, 556; 345/157, 179

(56) References Cited

U.S. PATENT DOCUMENTS

| | | | |
|---|---|---|---|
| 5,189,632 A | * 2/1993 | Paajanen et al. | ............ 455/556 |
| 5,311,175 A | * 5/1994 | Waldman | .................... 379/368 |
| 5,815,139 A | * 9/1998 | Yoshikawa et al. | ......... 345/157 |
| 6,295,052 B1 | * 9/2001 | Kato et al. | .................. 345/179 |

FOREIGN PATENT DOCUMENTS

| | | | | |
|---|---|---|---|---|
| DE | 4008598 | 8/1995 | | |
| DE | 19609026 | 10/1998 | | |
| GB | 2048531 A | * 12/1980 | | ................. 379/368 |
| GB | 2299302 A | * 2/1996 | | ................. 379/368 |
| JP | 4319719 | 11/1992 | | |
| WO | WO 96/27947 | * 9/1996 | | ................. 379/368 |

* cited by examiner

Primary Examiner—Jack Chiang
(74) Attorney, Agent, or Firm—Norris McLaughlin & Marcus

(57) ABSTRACT

The aim of the invention is to provide a device and a method for selecting text from an electronic memory using a numeric telephone keyboard. To this end, a digital telephone keyboard has at least one pressure sensor sensing the pressure exerted on one or more keys, control electronics processing an input via key confirmation and text display. The pressure exerted on the keys of the digital telephone keyboard is detected and measured for every key by a pressure sensor. The respective pressure value is transmitted to and processed by control electronics. The measured pressure value is shown on a display for every key. The pressure value exerted is changed for the key pressed, if necessary, and once the correct pressure value is reached and shown on the display, the pressure value for every pressed key and information on the selected key are transmitted for further processing of the measured values.

10 Claims, 5 Drawing Sheets

Telephone keyboard with associated characters

Fig. 1    Telephone keyboard with associated characters
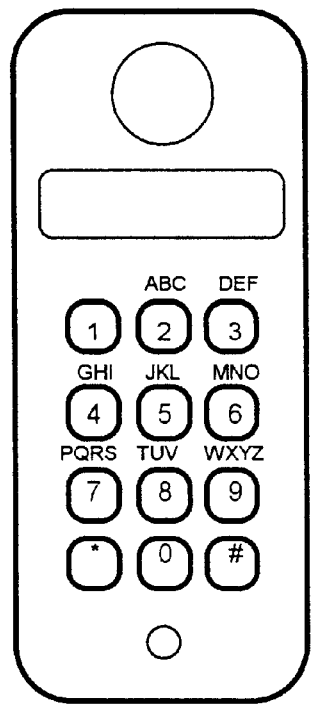

Fig. 2    Mechanical design of a telephone keyboard, seen from the side
Fig. 3    Components of the invented telephone keyboard Fig. 4    Diagram of a sample key pressure measurement
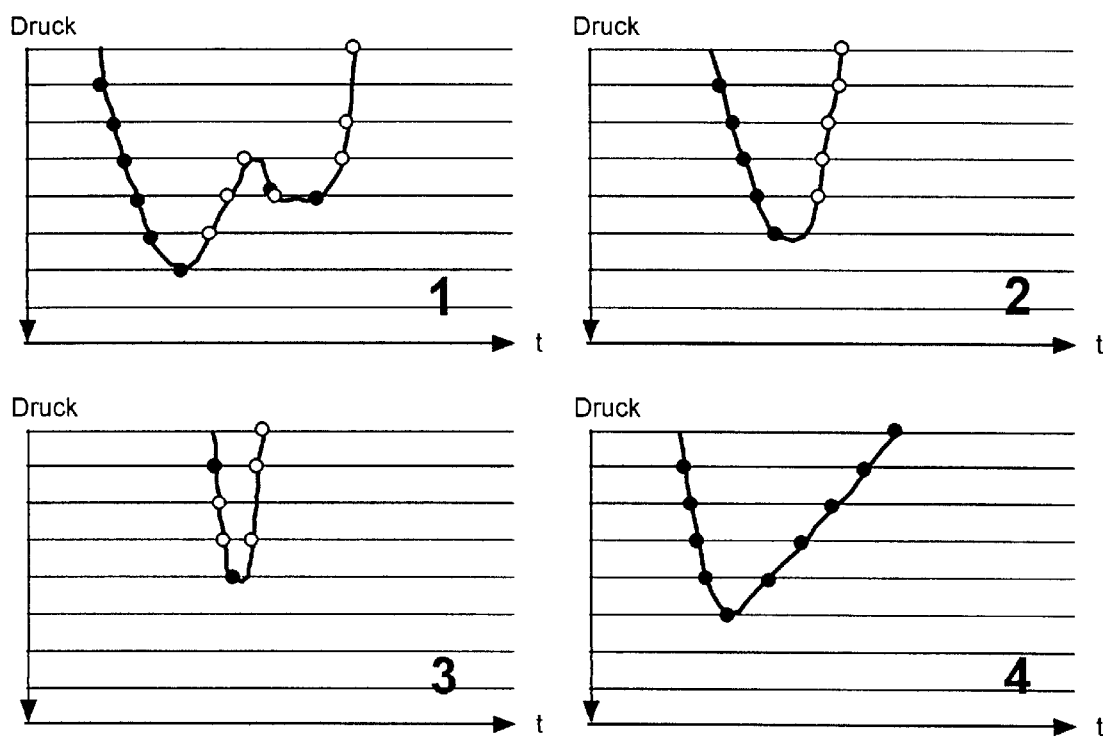

Fig. 5   Table: Letter input with numeric keyboard

| Item | Letters | Normal input | New system |
|---|---|---|---|
| Bertrand | BE | 2233 | 2 |
| Claudia | CL | 222555 | 2. |
| Dieter | DI | 3444 | 3 |
| Ernst | ER | 33777 | 3.. |
| Esso Hamburg | ES | 337777 | 3... |
| Esso Hannover | ESv | 337777v | 3.... |
| Fritz | FR | 33777 | 3..... |
| Ina | IN | 44466 | 4 |
| Meier | ME | 633 | 6 |
| Miller P | MI | 6444 | 6. |
| Miller S | MIv | 6444v | 6.. |
| Miller T | MIvv | 6444vv | 6... |
| Oliver | OL | 666555 | 6.... |
| ... | | | |
| Schmidt | SC | 7777222 | 7... |
| Schulze | SCv | 7777222v | 7.... |
| Ulla | UL | 88555 | 8 |
| Ulrich | ULv | 88555v | 8. |
| Viktor | VI | 888444 | 8.. |
| Werner | WE | 933 | 9 |
| Zander | ZA | 99992 | 9. | v = Cursor down key
. = continued pressure

Fig. 6   Single/multiline display

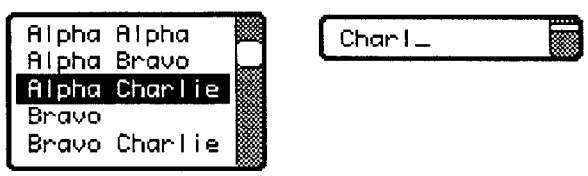

Fig. 7    List of steps to evaluate the sensor information

```
procedure keypress();
    // uses getpress(), display(), scrollbar(), blip()
    const intvl:= 50; // interval between measurements in ms
    const oktime:= 15;  // minimum no. of intervals
    int choice:= 0;   // current selection
    int p:= 0;    // pressure now
    int oldp:= 0; // pressure before
    int t:= 0;     // time (no. of intervals)
    loop    // repeat as long as pressure is applied
      p:= getpress(); // determine pressure
      if p=0 then exitloop();   // user lifts finger, finished
      if p<>oldp then // pressure was changed
         begin // #1
         oldp:= p;
         t:= 0;  // restart timer
         blip(); // short click sound for audible feedback
         scrollbar(p); // make new pressure visible
       end;
       else   // pressure is same for at least 2 intervals
         begin
         t:= t+1;  // increment timer
         if (p<>choice) then // this pressure could change selection
             if (p>choice) or (t>oktime) then // higher or longer pressure
               begin // #2
               choice:= p; // change selection
               display(choice);    // show it
               end;
           end;
       sleep(intvl);   // give other processes time;
    endloop;
    scrollbar(0); // hide scrollbar
end procedure;
```

DEVICE AND METHOD FOR QUICKLY SELECTING TEXT FROM A LIST USING A NUMERIC TELEPHONE KEYPAD

BACKGROUND OF THE INVENTION

A method for fast selection of text items from a list using a numeric telephone keyboard and an apparatus for fast and simple selection of letters from an electronic directory is provided.

In order to enter letters with a numerical keyboard, it is common to associate groups of letters with each numeric key.

Electronic telephones with a display are today usually equipped with an electronic directory that allows to store approx. one hundred names together with the corresponding telephone numbers. Tradition, cost and the limited space available have led to a situation where the numeric keyboard originally designed for telephone numbers is still being used.

Because fewer keys are available than necessary for input of letters and international characters, each numeric key has to be associated with more than one letter. A standard alphabetical sequence has been established for this.

In order to recall any item from the electronic directory, the following steps are required:

Select function "telephone directory"

Enter one or more of the first letters of the desired person's name. While it is desirable to enter as many letters as possible in order to determine the correct result, entering letters is tedious because of the multiple-function keyboard. Up to eight keys have to be pressed in order to enter two characters.

An Enter key accepts the input and displays the directory. This step is omitted in some implementations to speed up the process, however this complicates the input process. Without an Enter step, it is unclear whether the arrow keys scroll the directory or move the cursor within the input string.

In the directory the item that is alphabetically nearest to the text input is highlighted.

If this is the desired item, it can be activated for dialling. Otherwise, it is necessary to scroll within the directory with the arrow keys. This is common when people with aphabetically adjacent names like "Miller J." and "Miller P." or company branches like "Esso Hamburg" and "Esso Hanover" are stored.

As an Alternative to This Process, There are the Following Solutions

Most telephone manufacturers offer shortcuts as an alternative. These shortcuts link items either with a number (hard to remember) or to multiple functions of existing keys (even more complicated). The Call List (the last n calls can be recalled from a list) is no substitute for the full directory, either.

One manufacturer offers the "Jog Dial", a dial to scroll in an electronic directory. This is faster than with a keyboard and the dial reacts to the speed that it is manipulated. The "Jog Dial" is easy to understand, too. But the time advantage is insignificant, because the fingers have to move from the keyboard to the dial.

Another manufacturer has demonstrated a mobile phone that reacts to voice input. Because of the unreliable operation of voice recognition, (especially under difficult conditions during travel with background noise), this allows only a selection from a small subset of the directory. So currently this solution is almost unusable.

One manufacturer produces a phone with an LCD touch screen in place of the keyboard. This allows to include a powerful graphical user interface with a pen as an input device. Although the cost is high for such a solution, entering simple digits is not as easy as with a keyboard. A fast name selection with one finger (maybe even the thumb) is not achieved by this solution.

SUMMARY OF THE INVENTION

The invention aims to offer a fast selection of text items from a list of between twenty and a few hundred items using a numerical telephone keyboard, with an easy-to-use and fast procedure and a simple construction that can be produced at a low price.

The invention is based on the task to develop an apparatus and a method for a fast selection of text items from a list stored in an electronic memory using a numerical telephone keyboard.

BRIEF DESCRIPTION OF THE DRAWINGS

The invention is explained by reference to an example. The accompanying drawings show:

FIG. 1 Telephone keyboard with associated letters

FIG. 2 Mechanical design of a telephone keyboard, seen from the side

FIG. 3 Components of the invented telephone keyboard

FIG. 4.Diagram of a sample key pressure measurement

FIG. 5.Table: Letter input with numeric keyboard

FIG. 6. Single/multiline display

FIG. 7. List of steps to evaluate the sensor information

DESCRIPTION OF THE PREFERRED EMBODIMENT

The telephone keyboard of the invention consists of four components, a normal digital keyboard A, a pressure sensor B that measures the pressure upon keys in the range of 10 g up to approx. 1000 g, an electronic processing unit C to evaluate the input and a display D with text content (FIG. 3).

It is possible to use one pressure sensor B for each key. If the keys are mechanically connected and can move minimally as a group towards the housing, a single pressure sensor can be sufficient to measure the applied pressure on any key. This is possible because the key trigger action and the applied pressure are detected separately.

Pressing a key closes an electric circuit in A. Additionally, the key press activates the sensor B, and the information of the selected key and the concurrently applied pressure at the same time is transmitted to the processing unit C. If a key is held down, the pressure is repeatedly measured several times per second and the value is sent to the processing unit. The processing unit C evaluates the input, so that depending on the pressed key and the applied pressure different items are displayed from a list in memory within a response time of less than a second. The processing unit must react quickly enough to allow an easy operation but not so fast that it would be subject to trembling.

The person using the apparatus can react to the display during the key press to increase or decrease the applied pressure, or choose another key, until the desired item is displayed. When the key is released, the last selected item is kept in the display.

Another step can activate the selected item, e.g. the Dial-key can call the designated person. This apparatus is especially convenient to select names from a stored directory and also for input of alphabetic characters with a numeric keyboard. Other forms of feedback are possible in place of the display, e.g. an acoustic feedback with an artificial voice.

Keyboards are a convenient input device for operation by hand for small electronic devices that are intended for quick operation and in conjunction with other activities. However, human beings can do much more with their hands than pushing digital keys: They can pull, press, twist, push etc. objects. The common keys from electronic keyboards only interpret one yes/no information; this is sufficient for normal alphabetical and numeric input.

Humans can apply a variable pressure with their fingers in the range of approx. 10g up to approx. 1500g, but they cannot apply this pressure in exact steps. Without feedback, humans can only differentiate a few steps, such as "strong", "light" or "very soft" pressure. The situation changes when people receive a quick visible or audible feedback: Now humans can easily apply and hold a pressure of their choice up to a precision of a few gramms, for instance on a pair of scales. This is significant for the invention.

Pressure sensors are used for electronic games and musical instruments, but they have not yet brought much advantage to keyboards with multiple functions per key.

The processing unit must perform several operations in order to warrant ease of use. The following difficulties are a special challenge:

The reaction time: Measurement and evaluation must be performed fast enough to ensure that the selected list item can be displayed within 100 milliseconds or so. On the other hand, unstable pressure or trembling should not have much effect. This can be achieved by calculating the average of several measurements within an interval of 50 to 500 milliseconds. The displayed selection should be kept unchanged during that period.

Applied force and the association to list items: Depending on the number of list items, the steps of pressure can be smaller or larger. These steps, e.g. 30g–100g–300g–600g can either bei calculated by an algorithm on-the-fly or they can be taken from a table.

In order to control the results of a small drift (slow and minor unintentional increase or decrease of pressure), a change threshold needs to be reached before a change of pressure has any effect.

If a single pressure sensor is used, the physical position of the keys on the keyboard need to be taken into account. For instance, if the sensor's position is underneath the key "5" of a telephone keyboard, then the key "5" needs to react upon a smaller pressure compared to the keys "1", "3", "7" and "9" at the outside because the keyboard acts as a lever.

The absolute precision of the sensor can be low to keep cost down. However, relative pressure changes must lead to an exact reaction of the sensor and the processing unit to ensure comfortable operation. This can be achieved for instance by an automatic adjustment or calibration to the applied forces.

The numeric telephone keyboard according to the invention allows to select items from a stored list with significantly less steps compared to the common technology of accessing letters with multiple functions and several key presses. (Table, FIG. 5).

With a traditional keyboard, it is difficult to access an item from the alphabetically sorted name list by entering letters: Depending on the number of items with identical first letter sequences, one, two or more letters are required to identify the desired entry. The pressure-sensitive keyboard of the invention allows to select any item with single, variable keypress. There is also an advantage in letter-entry mode, although this might not be obvious.

Sample string "EXAMPLE"

Traditional input method: 339926755533

New system: 3.9.2675..3.

Entering text is not only easier, but also faster, because the user does not have to lift his or her finger from the keyboard during letter input.

An algorithm to evaluate the measured key pressure values is described in the following. To decide which of the measured values is used for the selection, two simple rules are applied:

The highest pressure that is held over two subsequent measurement cycles is taken. Measurements are repeated in specific time intervals intvl.

However, if after that a lower pressure is held for a specific number of measurement cycles oktime or longer, then this lower pressure is taken.

This ensures that the system reacts faster to key pressure (increased force) than to release of a key. This prevents errors caused by slow sliding away from a key etc.

Typical values for intvl could be approx. 80 ms; oktime could have 10 intervals (resulting in 10 * intvl=800 ms). The intvl time should be kept slightly under the reaction time, oktime * intvl should be higher than the reaction time. As trained users can operate the apparatus faster, these two variables could be user-definable within a few steps.

This is comparable with the preferences for mouse speed and double-click time with computer mice.

The Listing in FIG. 7 shows the algorithm written in pseudo-code of a programming language similar to Pascal. This algorithm ensures that the following conditions are met:

Values need to be measured for at least two subsequent intervals to have an effect. This prevents noise from random changes caused by trembling, shaking etc. (e.g. while driving a car).

There is always a result. In the rare case of a pressed key with zero pressure at the first measurement, a zero selection is returned.

The display always indicates the current pressure, if the display speed is sufficient. If the changes are faster than the process can evaluate, the display will follow with a little delay, i.e. some values are dropped in the display. However, the display never prevents a fast input, because the value is registered nevertheless.

The algorithm terminates immediately (within one interval) when a key is released.

An increased pressure is always recognized immediately (within the next interval) and at least the scroll bar is updated.

A constant pressure will lead to a corresponding display not later than after the interval oktime.

Releasing a key quickly will preserve the displayed value.

However, when a key is released slowly (min. oktime for each pressure interval) it is possible to select lower pressure steps. This is similar to scrolling backwards.

The algorithm requires only a minimum of processing power. Parallel running processes are not slowed down and the microprocessor can be operated in an energy-saving mode.

FIG. 4 gives some examples for the development of measured values during operation. The black dots indicate the situations when an increased or a continued pressure leads to a new selection (the lines marked #1 and #2 in the listing are processed). The white dots indicate the situation when a changed pressure is measured and the scroll bar in the display is updated, but the selection is not changed (#1 in the listing). After the process, the pressure that is indicated with the rightmost black dot in the diagram is effective. The diagrams illustrate the following cases:

Strong pressure that is slowly released and then increased again. This corresponds to an inexperienced user searching the designated value (FIGS. 4, 1).

Pressure up to the designated value, then release (FIGS. 4, 2). This corresponds to a user who has already developed a feeling for the force, but increases the pressure just slow enough to receive feedback from the display for these values.

Fast, aimed press and subsequent release (FIGS. 4, 3). Within such a short period it is impossible to display all intermediate values, leading to the white dots during the pressdown-period. Nevertheless, the right value is selected.

Slow pressure, very slow release (FIGS. 4, 3), this allows the display of all intermediate values. This is useful e.g. to browse the entries. At the end, the lowest pressure is selected.

The diagrams illustrate that the association of a key pressure to selection steps is a complex procedure. The algorithm needs to deliver a continuous feedback depending on sensor information and timing. It is necessary to get used to this system to operate it smoothly. (This disadvantage is also valid for the traditional entry system).

FIG. 6 gives some examples for the display design. A scrollbar at the right side of the display provides visual feedback to the applied pressure. The white rectangle of the scrollbar moves to the bottom when the pressure is increased. This scrollbar is only visible as long as a key is held down.

What is claimed is:

1. A numerical telephone keyboard, comprising a keyboard of a digital telephone wherein at least one key thereof is movable in response to an applied force and has associated therewith a plurality of different text items, the keyboard being equipped with at least one pressure sensor for measuring a relative strength of an applied force on the at least one key, a processing unit means for evaluating input from the keyboard as to which of the at least one key has been pressed and from the at least one pressure sensor as to the relative strength of the applied force on said at least one key which has been pressed, and a display means for displaying discrete text information determined by the processing unit means in response to the input.

2. The numerical telephone keyboard of claim 1, wherein said at least one pressure sensor is adapted to measure the force upon the keys in the range of approx. 10g–1500g.

3. The numerical telephone keyboard of claim 1, wherein the display means Is one or both of a visual display means and an audible display means.

4. The numerical telephone keyboard of claim 1, wherein said keyboard comprises keys for the digits 0 to 9 and for special characters, and wherein at least one of said keys is also associated with at least two distinct text characters.

5. A method for selection and recall of information stored in lists using a keyboard of a digital telephone having a plurality of keys, at least one of said keys being movable in response to an applied force and being associated with at least two distinct text characters, comprising the steps of:

applying a variable, controlled force to a first of the at least one of said keys of the keyboard, measuring a value of relative strength of an applied force with a pressure sensor, transmitting the measured value of relative strength to a processing unit, evaluating the measured value by way of the processing unit and associating the measured value with an item of discrete text information, displaying the discrete text information on a display of the digital telephone, optionally changing the applied force applied to said one of said keys, transmitting information about the changed applied force to the processing unit for further processing.

6. The method of claim 5, wherein the applied force upon each key is measured for at least two subsequent measurement cycles to determine the relevant measurement value, the measurement cycles having a defined time interval.

7. The method of claim 5, wherein the measurement of the applied force Is performed when the key is pressed, and again when the applied force is decreased by releasing the key.

8. The numerical telephone keyboard of claim 1, wherein the processing unit further comprises means for selecting a higher value of at least two values of applied force measured over at least two succeeding measurement cycles, and means for assigning a reference value based on the selected value.

9. The numerical telephone keyboard of claim 8, wherein the measurement cycles have a specific time interval.

10. The numerical telephone keyboard of claim 8, wherein the processing unit further comprises means for selecting a lower value of applied force, if a lower value is applied for at least a specified number of number of measurement cycles, and means for assigning a reference value based on the selected value.

* * * * *